(12) United States Patent
Ookoshi et al.

(10) Patent No.: US 8,409,958 B2
(45) Date of Patent: Apr. 2, 2013

(54) METHOD OF MANUFACTURING SEMICONDUCTOR DEVICE

(75) Inventors: Katsuaki Ookoshi, Yokohama (JP); Masatoshi Nishikawa, Yokohama (JP); Yosuke Shimamune, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/190,696

(22) Filed: Jul. 26, 2011

(65) Prior Publication Data
US 2012/0058610 A1 Mar. 8, 2012

(30) Foreign Application Priority Data
Sep. 6, 2010 (JP) .................. 2010-199226

(51) Int. Cl.
*H01L 21/336* (2006.01)
(52) U.S. Cl. ............... 438/300; 438/303; 257/E21.431; 257/E21.634
(58) Field of Classification Search .............. 438/230
See application file for complete search history.

(56) References Cited

U.S. PATENT DOCUMENTS

| | | | | |
|---|---|---|---|---|
| 6,878,576 B1 * | 4/2005 | Mears et al. | .................. | 438/162 |
| 2005/0170594 A1 * | 8/2005 | Yeo et al. | ..................... | 438/300 |
| 2005/0285203 A1 * | 12/2005 | Fukutome et al. | ............ | 257/368 |
| 2006/0131656 A1 * | 6/2006 | Shin et al. | ..................... | 257/369 |
| 2007/0040225 A1 * | 2/2007 | Yang | .............................. | 257/369 |
| 2007/0105331 A1 * | 5/2007 | Murthy et al. | ................ | 438/341 |
| 2008/0166847 A1 * | 7/2008 | Utomo et al. | ................ | 438/301 |

FOREIGN PATENT DOCUMENTS

JP 2009-182109 A 8/2009

OTHER PUBLICATIONS

N. Yasutake et al., "Record-high performance 32 nm node pMOSFET with advanced Two-step recessed SiGe-S/D and stress liner technology", Symposium on VLSI Technology Digest of Technical Papers, 2007, pp. 48-49.

* cited by examiner

*Primary Examiner* — Michelle Mandala
*Assistant Examiner* — Shaka White
(74) *Attorney, Agent, or Firm* — Westerman, Hattori, Daniels & Adrian, LLP

(57) ABSTRACT

A method of manufacturing a semiconductor device is provided. The method includes forming a gate electrode on a semiconductor substrate; forming a dopant implantation area in the semiconductor substrate by implanting a dopant in the semiconductor substrate, using the gate electrode as a mask; forming sidewalls on the gate electrode; forming a first recess by etching the semiconductor substrate, using the gate electrode and the sidewalls as a mask; forming a second recess by removing the dopant implantation area positioned below the sidewalls; and forming a source area and a drain area by causing a semiconductor material to grow in the first recess and the second recess.

15 Claims, 10 Drawing Sheets

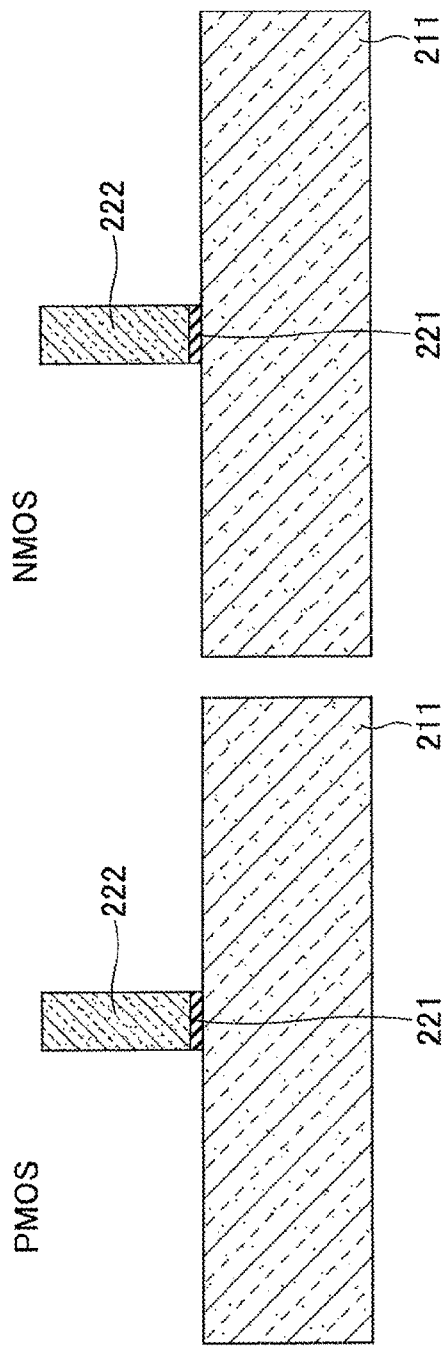
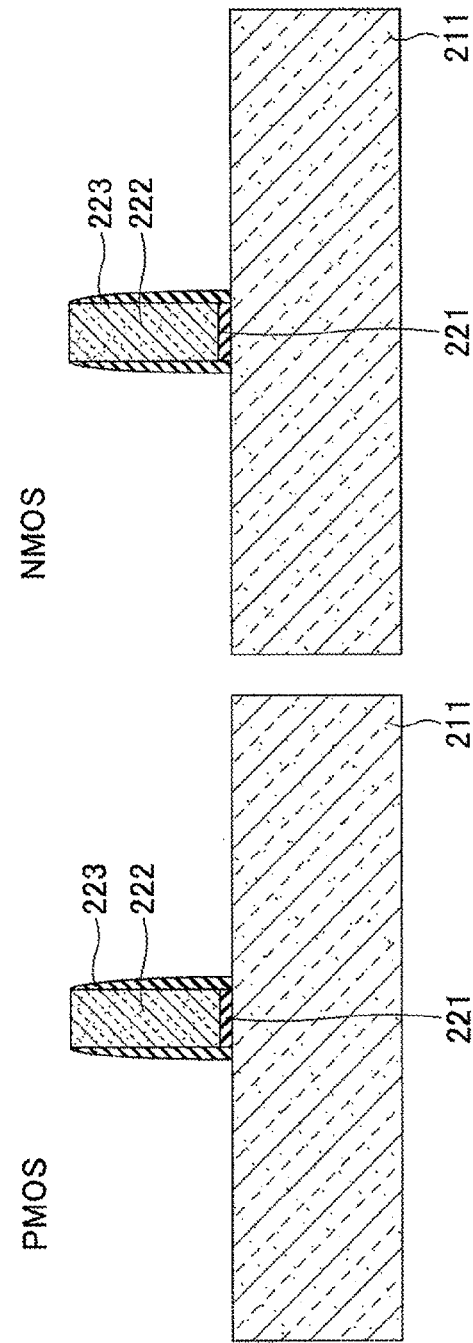
FIG.4A
FIG.4B

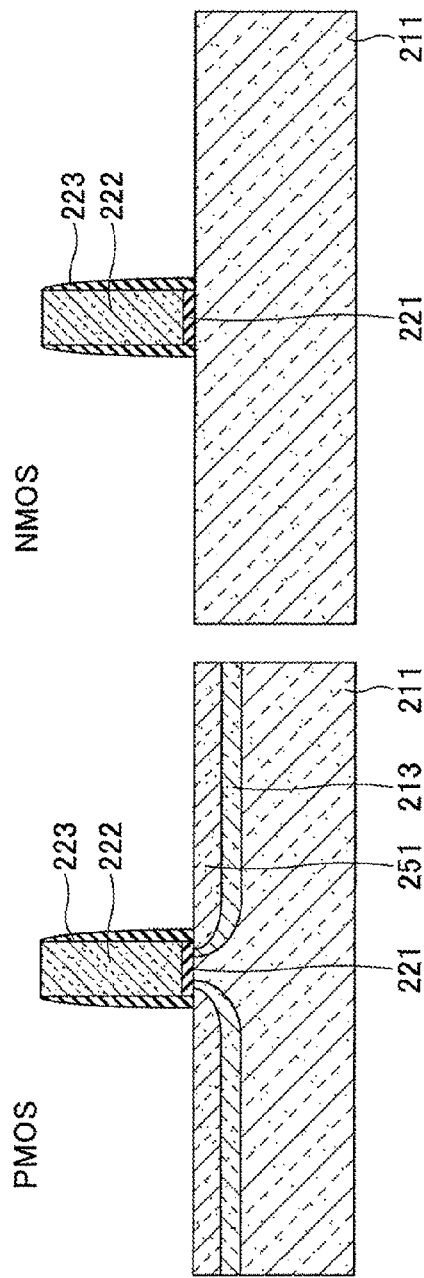
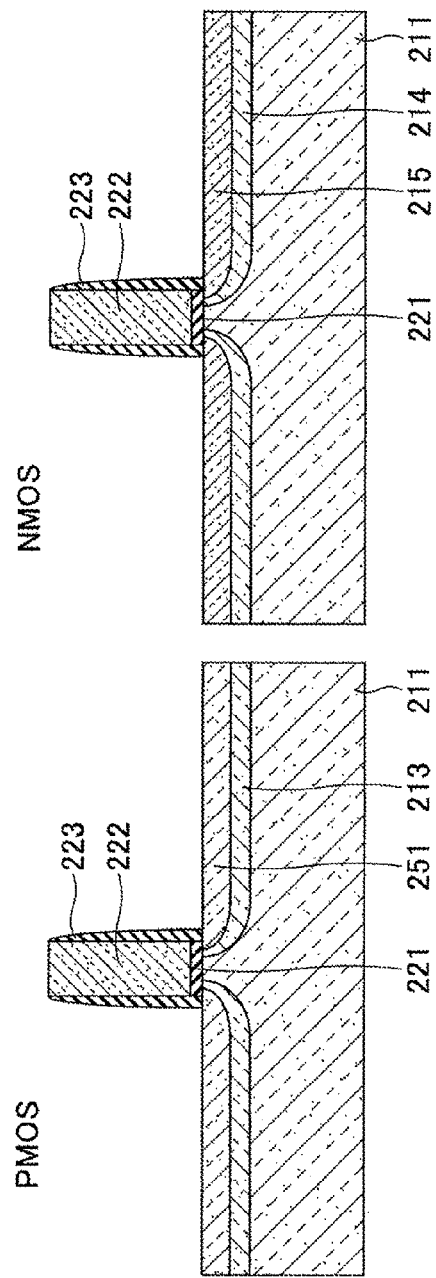
FIG.4C
FIG.4D

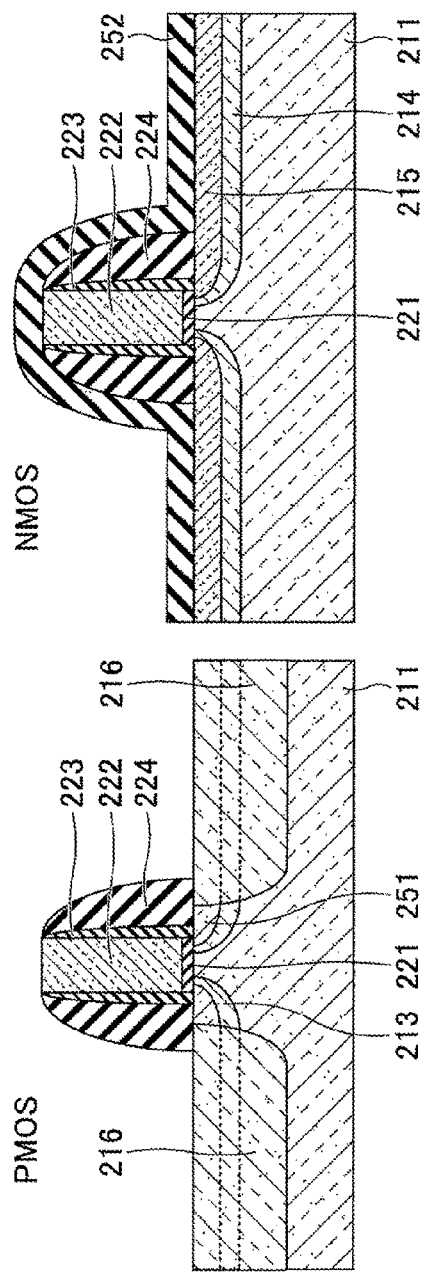
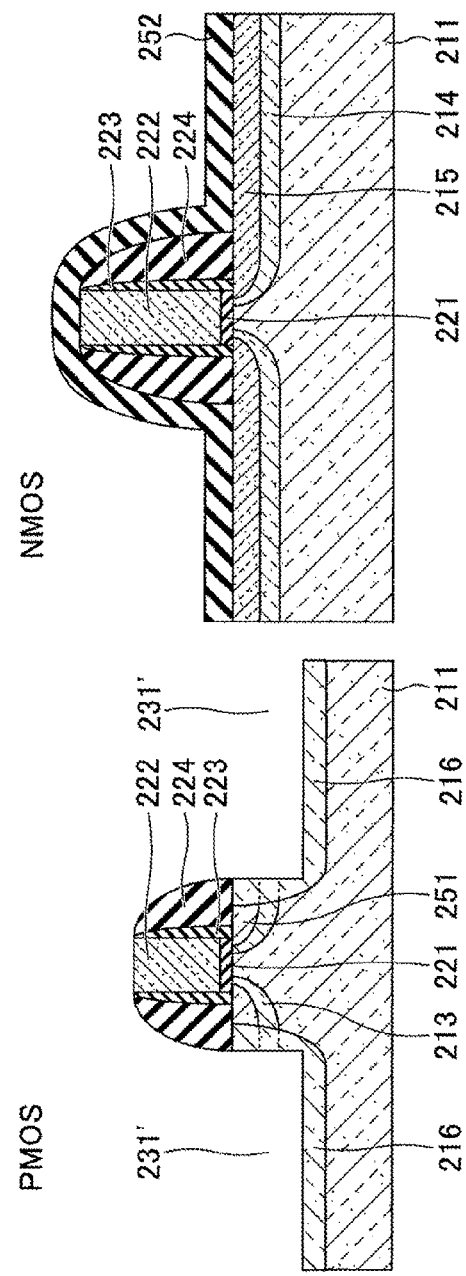
FIG.5C
FIG.5D

METHOD OF MANUFACTURING SEMICONDUCTOR DEVICE

CROSS-REFERENCE TO RELATED APPLICATION

This patent application is based upon and claims the benefit of priority of the prior Japanese Patent Application No. 2010-199226 filed on Sep. 6, 2010, the entire contents of which are incorporated herein by reference.

FIELD

The embodiments of the present invention discussed herein are related to a method of manufacturing a semiconductor device.

BACKGROUND

Various miniaturization technologies are being developed in order to increase the integration density of elements in a semiconductor device. Presently, by using such a miniaturization technology, transistor devices having a gate length of, for example, less than or equal to 90 nm, are being manufactured.

The purpose of increasing the integration density of elements in a semiconductor device includes increasing the driving speed and reducing power consumption. However, in a transistor device having a gate length of, for example, less than or equal to 90 nm, the leak current increases as the gate length decreases due to miniaturization. This impedes the reduction of power consumption. Meanwhile, when an attempt is made to reduce the leak current to less than or equal to a predetermined value, it becomes difficult to enhance the current driving capability of the transistor. As described above, there is a trade-off relationship between enhancing the driving capability of the transistor and reducing power consumption. Accordingly, new approaches are being sought to enhance the performance of transistors.

One of the new approaches is the strained silicon technology. This technology involves applying stress to a channel area and changing the energy band structure to reduce the effective mass of the carriers and to increase the carrier mobility, so that the current driving capability of the transistor is enhanced. It is known that in a metal-oxide semiconductor field-effect transistor (MOSFET), the carrier mobility is increased by applying uniaxial strain to the channel area. In a P-type channel transistor, hole mobility is increased by applying stress (compressive stress) for compressing the channel from the source/drain and generating compressive strain. In an N-type channel transistor, the mobility of electrons is increased by applying stress (tensile stress) for stretching the channel from the source/drain and generating tensile strain.

There is proposed a transistor having a so-called embedded structure. Specifically, to apply compressive stress or tensile stress to the channel area, a recess is formed in the source/drain area. In the recess, a material, which is different from that of the semiconductor substrate including the channel area, is epitaxially grown. For example, in a P-type channel transistor having a channel area of silicon (Si), silicon germanium (SiGe) is typically embedded as the source/drain area. Then, when the SiGe epitaxially grows, boron (B) is added by in-situ doping. Accordingly, the parasitic resistance of the source/drain is reduced. By reducing the resistance of the source/drain, the transistor performance is improved, in combination with the effect of increasing mobility by stress. In an N-type channel transistor having a Si channel area, carbon-doped silicon (SiC) is typically used instead of SiGe, and phosphorus (P) or arsenic (As) is typically used instead of B.

FIG. 1 schematically illustrates a transistor 10 having such an embedded structure. The transistor 10 includes a semiconductor substrate 11, a gate insulating film 21 formed on the semiconductor substrate 11, a gate electrode 22, and side walls 24. The transistor 10 includes source/drain areas 31 embedded in recesses formed in the semiconductor substrate 11. The transistor 10 further includes a pair of source/drain extension areas 33 provided below the side walls 24 and adjacent to the source/drain areas 31. Furthermore, a channel area 12 is positioned between the pair of source/drain extension areas 33, i.e., below the gate electrode 22. The source/drain extension areas 33 are formed by implanting ions after forming a pattern of the gate electrode 22. Subsequently, the side walls 24 are formed. Then, the source/drain areas 31 are formed by forming recesses and, causing selective epitaxial growth.

In the case of a P-type channel transistor, SiGe source/drain areas 31 in which B is doped at high density function as low resistance stressors that apply compressive stress to the channel area 12. However, in a short channel area, in order to prevent a short channel effect, the source/drain extension area is to be formed in a shallow, dense manner along the substrate direction. Accordingly, in conventional cases, such a source/drain extension area is typically formed by ion implantation. Meanwhile, there has been demand for applying strong compressive stress from the source/drain to the channel.

In order to respond to such demand, one approach is to reduce the source/drain extension areas 33 so that the SiGe source/drain areas 31 are closer to the channel area 12 and the stress applied to the channel area 12 is increased. However, making the SiGe source/drain areas 31 closer to the channel area 12 is the same as making the source/drain junction closer to the gate, as viewed in the distribution of B which is an impurity. Therefore, depletion layers from the source/drain interfere with each other due to B included in the SiGe source/drain areas 31. Consequently, a short channel effect occurs. Accordingly, the operations of the transistor cannot be controlled by the gate voltage. For this reason, there are limitations to make the SiGe source/drain areas 31 close to the channel area 12. Furthermore, when the density of B in the SiGe source/drain areas 31 is reduced for the purpose of improving roll-off properties, the parasitic resistance of the source/drain increases, and the speed of epitaxial growth decreases significantly, which are disadvantageous factors in terms of manufacturing products.

Another approach for preventing the stress from decreasing and for preventing the parasitic resistance from increasing due to the source/drain extension areas 33 is as follows. That is, the conventional source/drain extension areas 33 formed as a diffuse layer may be replaced by a layer formed as an epitaxial layer. FIG. 2 illustrates a transistor 100 including such an epitaxial layer. The transistor 100 may be substantially the same as the transistor 10 illustrated in FIG. 1, except that the source/drain extension areas 33 are replaced by epitaxial areas 132. The transistor 100 includes step-like source/drain epitaxial areas 130. The source/drain epitaxial areas 130 include first areas 131 corresponding to the conventional source/drain areas 31 and second areas that are the epitaxial areas 132 (shallower than the source/drain extension areas 33) provided adjacent to a channel area 112. For example, in a P-type transistor, the source/drain epitaxial areas 130 may be made of SiGe.

In the transistor 100, the source/drain epitaxial areas 130 (including the epitaxial areas (second areas) 132 adjacent to the channel area 112) function as a stressor. Therefore, stress is efficiently applied to the channel area 112, so that the hole mobility or electron mobility is increased. Furthermore, it is possible to reduce the parasitic resistance of the source/drain by doping B at high density in the source/drain epitaxial area 130 (including the shallow epitaxial areas (second areas) 132). Furthermore, a sufficient space is provided between the first areas 131 corresponding to the conventional source/drain areas 31 and the channel area 112, so that roll-off properties are prevented from degrading.

In order to form the transistor 100 including the step-like source/drain epitaxial area 130 indicated in FIG. 2, a process including a combination of forming a recess, embedding a stressor in the recess, and causing the stressor to grow, is to be typically performed twice. For example, after forming a gate electrode 122, recesses for the epitaxial areas (second areas) 132 are formed, and SiGe is caused to selectively grow in the recesses. Next, sidewalls 124 are formed. Then, recesses for the first areas 131 are formed, and SiGe is caused to selectively grow in the recesses. This method is complex and redundant compared to the method of manufacturing the transistor 10 described with reference to FIG. 1, because in this method, the process of forming the recesses and the process of selective epitaxial growth are to be respectively performed one more time, compared to the method of FIG. 1. Consequently, the manufacturing cost is increased.

Patent document 1: Japanese Laid-Open Patent Publication No. 2009-182109

Non-patent document 1: N. Yasutake and twelve others, "Record-high performance 32 nm node pMOSFET with advanced Two-step recessed SiGe-S/D and stress liner technology", 2007 Symposium on VLSI Technology Digest of Technical Papers, 2007, pp. 48-49

SUMMARY

According to an aspect of the present invention, a method of manufacturing a semiconductor device is provided. The method includes forming a gate electrode above a semiconductor substrate; forming a dopant implantation area in the semiconductor substrate by implanting a dopant in the semiconductor substrate, using the gate electrode as a mask; forming sidewalls on the gate electrode; forming a first recess by etching the semiconductor substrate, using the gate electrode and the sidewalls as a mask; forming a second recess by removing the dopant implantation area positioned below the sidewalls; and forming a source area and a drain area by causing a semiconductor material to grow in the first recess and the second recess.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 4A through 4D are cross-sectional views of a method of manufacturing a semiconductor device according to an embodiment of the present invention (part 1);

FIGS. 5A through 5D are cross-sectional views of the method of manufacturing the semiconductor device according to an embodiment of the present invention (part 2);

DESCRIPTION OF EMBODIMENTS

Figure 1:
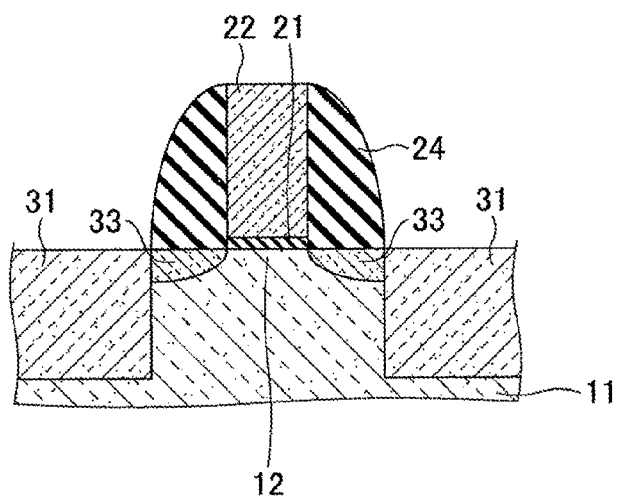
FIG. 1 is a cross-sectional view of a semiconductor device according to the conventional technology.

Preferred embodiments of the present invention will be explained with reference to accompanying drawings. In the drawings, various elements may not be indicated by the same scale. Furthermore, the same or similar components are denoted by the same or similar reference numerals throughout the drawings.

Figure 2:
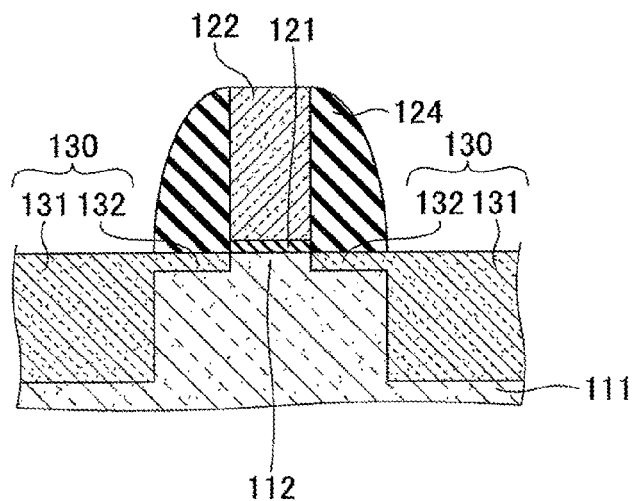
FIG. 2 is a cross-sectional view of a semiconductor device including a step-like epitaxial area.
Figure 3:
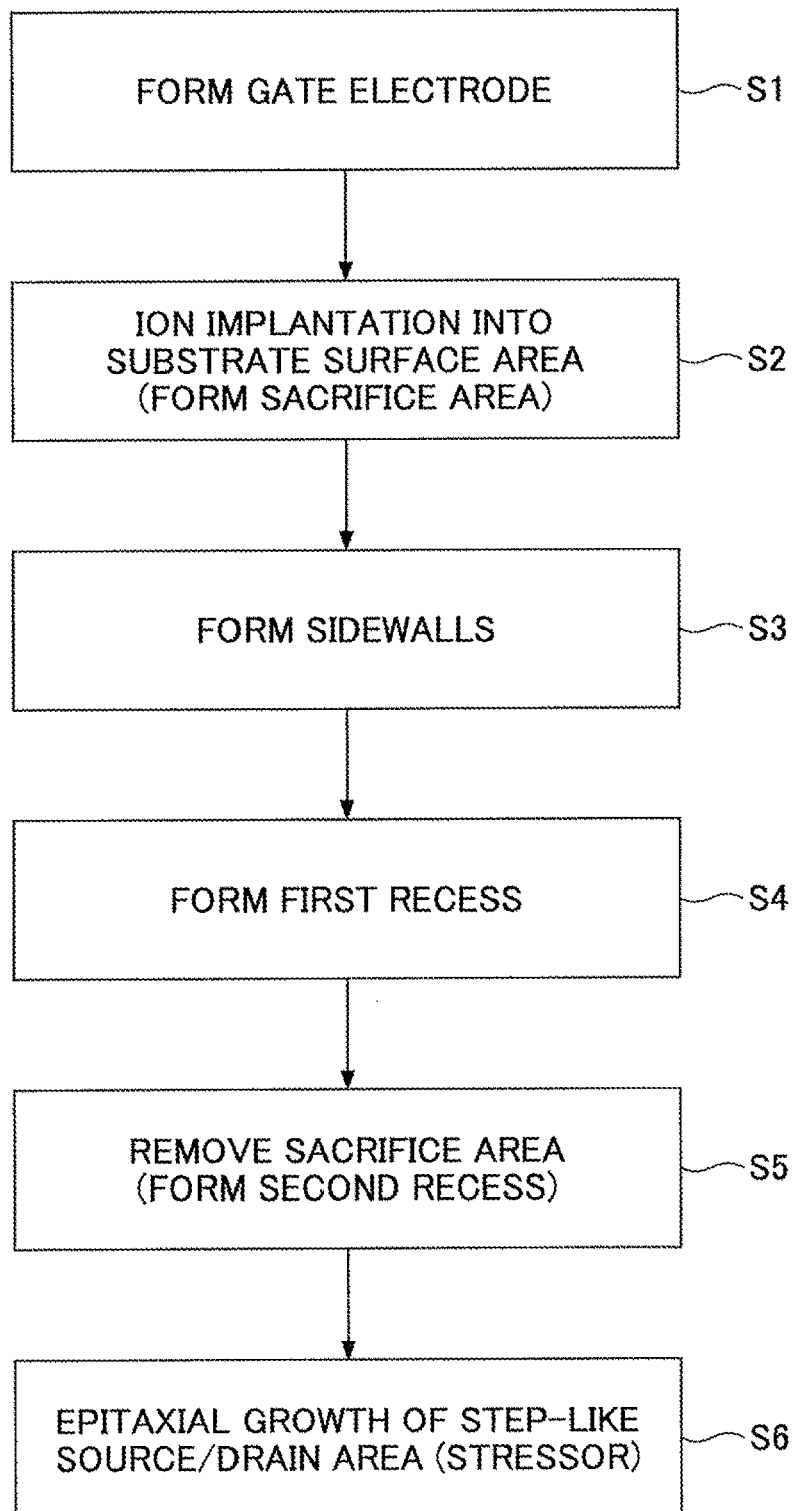
FIG. 3 is a flowchart of a method of manufacturing a semiconductor device according to an embodiment of the present invention.

First, with reference to FIG. 3, a description is given of the main procedures of a method of manufacturing a semiconductor device according to an embodiment of the present invention. With this method, it is possible to manufacture the transistor 100 including the step-like source/drain epitaxial area 130 indicated in FIG. 2. The manufactured transistor includes, for example, a P-type field-effect transistor such as a P channel MOSFET, or an N-type field-effect transistor such as an N channel MOSFET. In the following, a P-type field-effect transistor is referred to as "PMOS", and an N-type field-effect transistor is referred to as "NMOS".

In step S1 of FIG. 3, a gate insulating film 121 and the gate electrode 122 are formed on a semiconductor substrate 111 such as a Si wafer.

In step S2, dopant is implanted in the surface area of the semiconductor substrate 111, so that shallow dopant implantation areas having shapes similar to the epitaxial areas (second areas) 132 of FIG. 2 are formed, by using the formed gate electrode 122 as a mask. This dopant is selected such that the selective etching ratio of the dopant implantation areas is higher than that of the semiconductor substrate 111, when a semiconductor substrate material such as Si is etched under predetermined conditions (see step S5 below). This dopant to be implanted in the Si substrate may be, for example, As or P. As described above, when manufacturing PMOS, an N type dopant such as As or P may be implanted, instead of implanting a P type dopant such as B that is usually needed for operating the PMOS. The dopant implantation areas are subsequently removed and replaced, and therefore in the following, the dopant implantation areas may also be referred to as sacrifice areas.

In step S3, the sidewalls 124 are formed on the sidewalls of the gate electrode 122. For example, sidewalls 124 are formed by depositing insulating films such as silicon nitride films, and performing anisotropic etching on the insulating films.

In step S4, first recesses are formed on the surface of the semiconductor substrate 111, by using the gate electrode 122 and the sidewalls 124 provided on the sidewalls of the gate electrode 122 as a mask. More specifically, the first recesses are formed in the semiconductor substrate areas that become the epitaxial areas (second areas) 132 of FIG. 2. For example, an RIE (reactive ion etching) method is performed. These recesses are formed to be deeper than the sacrifice areas formed in step S2, so that the sacrifice areas are exposed at parts of the inner walls of the recesses. Before forming the recesses, source/drain areas may be formed by ion implantation. For example, B may be ion-implanted in PMOS, and P may be ion-implanted in NMOS.

In step S5, the sacrifice areas are removed by selective etching. This step is accomplished because the sacrifice areas have a higher etching ratio than the semiconductor substrate 11, due to the implanted dopant. This etching is performed by using chlorine ($Cl_2$) gas, in a case where the sacrifice areas are made of Si implanted with As or P. By removing the sacrifice areas, second recesses shallower than the first recesses are formed, which are connected to the first recesses formed at step S4. The second recesses are formed between the semiconductor substrate 111 and the sidewalls 124. Accordingly, step-like recesses are formed at positions corresponding to the step-like source/drain epitaxial areas 130.

Then, in step S6, in the step-like recesses, the source/drain epitaxial areas 130 functioning as a stressor to the channel area 112 are caused to epitaxially grow. Accordingly, the step-like source/drain epitaxial areas 130 including the first areas 131 and the shallower epitaxial areas (second areas) 132 are formed. A material different from that of the semiconductor substrate 111 is used to form the source/drain epitaxial areas 130, so that the source/drain epitaxial areas 130 function as a stressor to the channel area 112. For example, when the semiconductor substrate 111 includes Si, SiGe is used in PMOS and SiC is used in NMOS. Furthermore, by implanting dopant at high density by in-situ doping during epitaxial growth, it is possible to reduce the resistance of the source/drain epitaxial areas 130 also functioning as the source/drain. The dopant may be, for example, B in PMOS and P in NMOS.

Furthermore, steps S5 and S6 are preferably continuously performed in the same device. For example, the etching procedure such as $Cl_2$ etching in step S5 is preferably performed in the same epitaxial growth device that is used in step S6.

By performing the above procedures, the embedded transistor 100 including the step-like source/drain epitaxial areas 130 illustrated in FIG. 2 is formed. Subsequently, an interlayer insulating film, a contact, a wiring layer, etc., are formed, so that a semiconductor device is formed.

With this method, it is possible to manufacture a transistor including step-like epitaxial areas illustrated in FIG. 2, by performing a series of procedures of a typical method for manufacturing a transistor (see FIG. 1) including a diffusion layer as an extension area. In step S5 described above, etching (for example, $Cl_2$ etching) is to be performed for removing the sacrifice areas; however, a conventional procedure may be performed at step S5 because the exposed Si surface is processed before epitaxial growth. Accordingly, with this method, a step-like source/drain epitaxial area having a function of applying stress to the channel area is formed without a significantly complex or redundant manufacturing process. Thus, manufacturing costs are prevented from increasing and transistor performances are enhanced.

In the following, a detailed description is given of the above manufacturing method, with reference to a non-limiting embodiment.

With reference to FIGS. 4A through 7C, a description is given of an example of a method of manufacturing a semiconductor device including a PMOS using the strained silicon technology and an NMOS that does not use the strained silicon technology. A semiconductor device typically includes many transistors that are positioned to form a desired circuit. These transistors may be electrically separated from each other by an element separation structure such as shallow trench isolation (STI). However, FIGS. 4A through 7C only indicate an area in which one PMOS is formed (indicated as "PMOS"), and an area in which one NMOS is formed (indicated as "NMOS").

A gate insulating film 221 and a gate electrode 222 are formed on, for example, a Si substrate 211 that is a Si wafer (FIG. 4A). For example, a gate insulating film and a material film for a gate electrode are deposited on the Si substrate 211, and photolithography is used to perform patterning on the gate electrode 222 and the gate insulating film 221.

Next, according to need, first sidewalls 223 are formed on the sidewalls of the gate electrode 222 (FIG. 4B). The first sidewalls 223 are relatively thin, having a thickness of, for example, less than or equal to 10 nm. For example, after forming a CVD-SiN film of 8 nm, the film is etched back by dry etching, so that the first sidewalls 223 remain on the sidewalls of the gate electrode 122.

Next, in the PMOS formation area, ion implantation is performed to form pocket implantation areas 213 according to need, and dopant implantation areas (sacrifice areas) 251 described at step S2 of FIG. 3 (FIG. 4C). The gate electrode 222 may be used as a mask for the ion implantation (the mask is considered to include the first sidewalls 223 if the first sidewalls 223 are formed). The pocket implantation is performed by implanting antimony (Sb) with energy of 10 keV through 80 keV so that the Rp range is 10 nm through 50 nm, by a dose amount of $1\times10^{12}$ $cm^{-2}$ (i.e., 1E12; these numerals are hereinafter indicated in the same manner) through 5E13 $cm^{-2}$. P or As may be used instead of Sb.

Ions are implanted into the dopant implantation area (sacrifice area) 251 by implanting As with energy of 0.4 keV through 6 keV, by a dose amount of 1E14 $cm^{-2}$ through 1E16 $cm^{-2}$, for example. By adjusting the dose amount to be in the aforementioned range, when etching is performed to remove the sacrifice region as described at step S5 of FIG. 3, it is possible to achieve a preferable etching ratio for the sacrifice region and/or a Preferable selective etching ratio with respect to the rest of the Si area. Furthermore, it is also possible to implant B, together with a dopant such as As for adjusting the etching ratio.

Next, in the NMOS formation area, ion implantation is performed to form pocket implantation areas 214 and extension areas 215, according to need (FIG. 4D). For example, indium (In) is implanted as the pocket, and As or P is implanted as the extension.

Figure 5A:
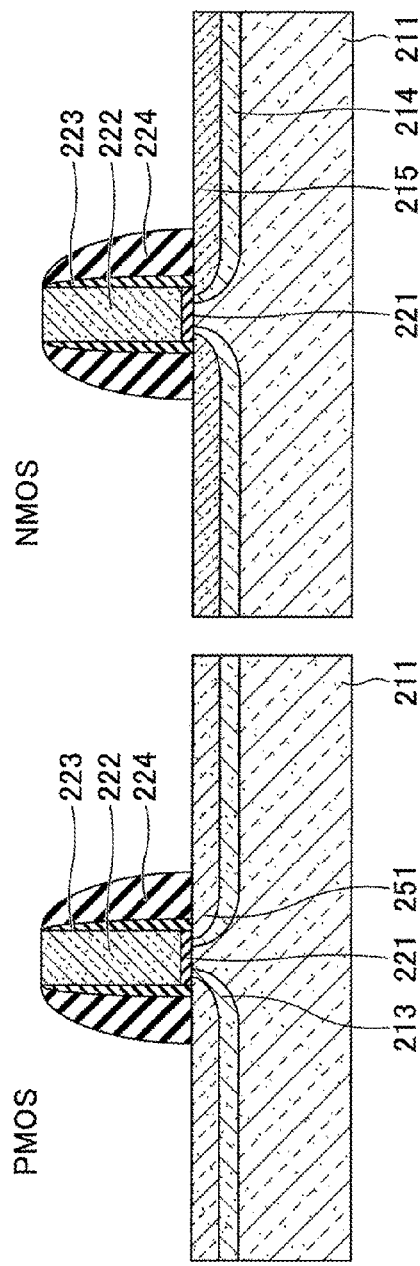

Next, in both the PMOS formation area and the NMOS formation area, second sidewalls 224 are formed on the sidewalls of the gate electrode 222 (FIG. 5A). For example, after depositing CVD-SiN having a thickness of approximately 35 nm with the use of BT-BAS (Bis Tertiary-Butylamino Silane), dry etching is performed so that the sidewalls 224 remain.

Figure 5B:
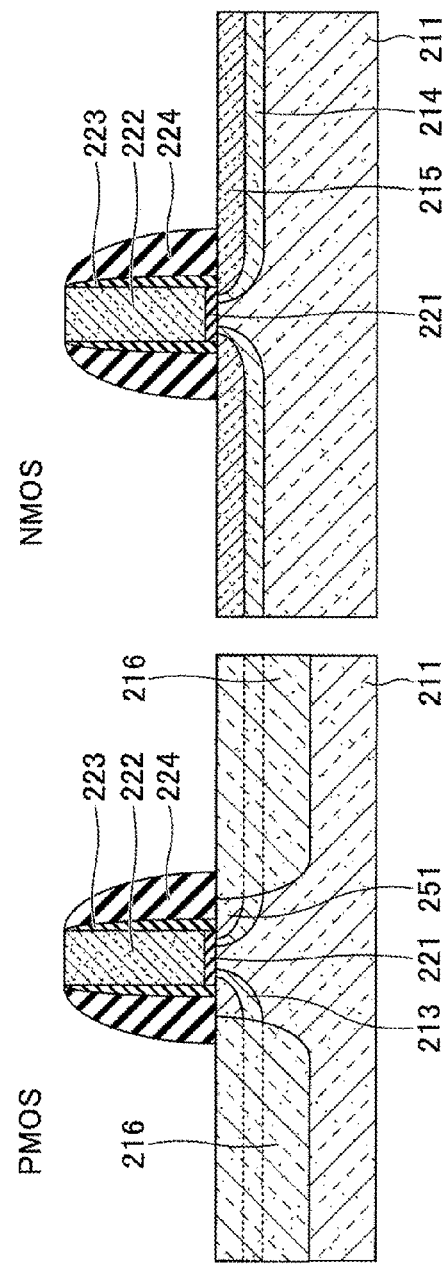

Next, according to need, in the PMOS formation area, B is implanted by using the gate electrode 222 and its sidewalls (first sidewalls 223 and second sidewalls 224) as a mask, to form a source/drain diffusion layer 216 (FIG. 5B). The source/drain diffusion layer 216 prevents a leak current from occurring in the source/drain junction. In FIGS. 5B through 5D, the dashed lines in the source/drain diffusion layer 216 indicate the source/drain diffusion layer 216 partially includes Sb in the pocket implantation areas 213 and partially includes As in the dopant implantation areas (sacrifice areas) 251.

Next, a protection mask 252 including a silicon dioxide film is formed, to cover the NMOS formation area (FIG. 5C). The protection mask 252 prevents the subsequent processes of forming a recess and epitaxial growth in the PMOS formation area, from affecting the NMOS formation area. For example, a CVD-SiO film having a thickness of approximately 7 nm and a high-density plasma SiO film having a thickness of approximately 30 nm are laminated on the entire Si substrate 211. Next, a resist mask is used to remove these films from the PMOS formation area, so that these films remain only in the NMOS formation area.

Next, in the PMOS formation area, the gate electrode 222, the first sidewalls 223, and the second sidewalls 224 are used as a mask to form a recesses 231' on the surface of the Si substrate 211 (FIG. 5D). The NMOS formation area is protected by the protection mask 252. The recesses 231' are formed to be deeper than the dopant implantation areas (sacrifice areas) 251. Accordingly, the areas in which As is implanted are exposed on the inner walls of the recesses 231'. Furthermore, the recesses 231' are preferably formed to be included in the source/drain diffusion layer 216 formed at the procedure of FIG. 5B. The recesses 231' are formed by etching the Si substrate 211 by the RIE method, to a depth of approximately 30 nm.

Furthermore, an additional etching process may be performed with TMAH (tetra methyl ammonium hydroxide), to an additional depth of approximately 15 nm. When etching is performed with TMAH, it is possible to attain a recess having an $\Sigma$ shape, as an etching ratio difference is present according to the crystal face orientation of Si. By forming a recess to have an $\Sigma$ shape, the stressor that is subsequently embedded will be able to apply stress to the channel area even more effectively.

After the procedure of FIG. 5D, the surface natural oxide film is peeled off by an HF process (for example, diluting by 0.07%), and the wafer is quickly conveyed to a SiGe deposition device while an active Si surface is exposed.

Figure 6A:
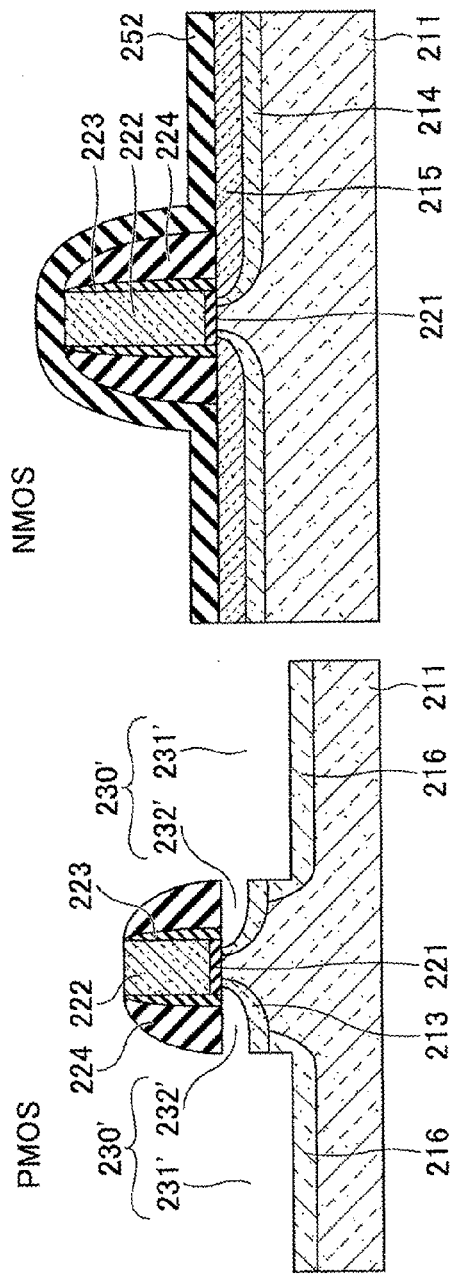
FIGS. 6A through 6D are cross-sectional views of the method of manufacturing the semiconductor device according to an embodiment of the present invention (part 3)

Next, in the SiGe deposition device, before epitaxial growth, the dopant implantation areas (sacrifice areas) 251 are selectively removed (FIG. 6A). Accordingly, in the areas where the dopant implantation areas (sacrifice areas) 251 have been formed, voids (shallow recesses) 232' that are adjacent to the recesses (deep recesses) 231' are formed. Thus, step-like recesses 230' are formed by the recesses 231' and the voids 232'. For this purpose, etching conditions appropriate for selectively etching the dopant implantation areas (sacrifice areas) 251 with respect to Si are selected, according to the type of dopant implanted in the dopant implantation areas (sacrifice areas) 251. For example, when As is implanted in the dopant implantation areas (sacrifice areas) 251, the dopant implantation areas (sacrifice areas) 251 are selectively etched by supplying gas including $Cl_2$, for example $Cl_2/H_2$ gas. In this case, appropriate etching conditions include a temperature of 500° C. through 600° C.; $Cl_2$ partial pressure of 0.5 Pa through 10 Pa, more preferably approximately 1 Pa; $H_2$ partial pressure of 20 Pa through 60 Pa, more preferably approximately 40 Pa; and an etching time of 1 min through 30 min.

Figure 6B:
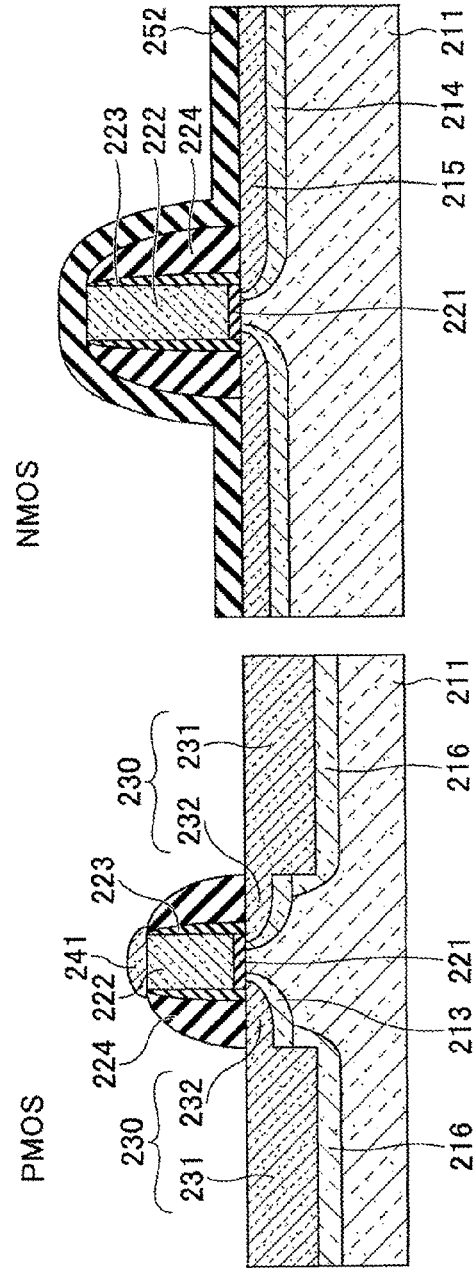

Next, preferably immediately after the procedure of FIG. 6A, in the same SiGe deposition device, SiGe doped with B is caused to epitaxially grow selectively on the exposed Si surface (FIG. 6B). Accordingly, SiGe doped with B is embedded in the deep recesses formed in the procedure of FIG. 5B and in the shallow recesses formed in the procedure of FIG. 6A. Accordingly, step-like source/drain epitaxial areas 230 including first areas 231 and second areas 232 are formed. Furthermore, a SiGe film 241 may also be formed on the gate electrode 222.

Appropriate conditions for depositing SiGe include a temperature of 500° C. through 600° C.; $H_2$ partial pressure of 20 Pa through 60 Pa; $SiH_4$ partial pressure of 1 Pa through 10 Pa; $GeH_4$ partial pressure of 0.05 Pa through 0.2 Pa; $B_2H_6$ partial pressure of 0.001 Pa through 0.006 Pa; and HCl partial pressure of 0.5 Pa through 5 Pa. More preferable conditions for depositing SiGe include a temperature of approximately 550° C.; $H_2$ partial pressure of approximately 40 Pa; $SiH_4$ partial pressure of approximately 2 Pa; $GeH_4$ partial pressure of approximately 0.1 Pa; $B_2H_6$ partial pressure of approximately 0.003 Pa; and HCl partial pressure of approximately 1 Pa. For example, the wafer is exposed in a mixed gas atmosphere for approximately 90 minutes in a temperature of 550° C., $H_2$ partial pressure of 34 Pa, $SiH_4$ partial pressure of 2 Pa, 10% $GeH_4/H_2$ partial pressure of 0.6 Pa, 0.1% $B_2H_6/H_2$ partial pressure of 1.77 Pa, and HCl partial pressure of 1.25 Pa. SiGe doped with approximately 1E20 $cm^{-3}$ of B and including approximately 20% of Ge is selectively grown on the exposed Si surface at a thickness of approximately 70 nm.

After a while, the dopant implantation areas (sacrifice areas) 251 in which, for example, As is implanted, are replaced by the SiGe areas (second areas) 232 doped with B. In the replacement process, in the same SiGe depositing device, the voids (shallow recesses) 232' may be formed by $Cl_2$ gas exposure, and SiGe may be simultaneously embedded in the voids (shallow recesses) 232' and the recesses (deep recesses) 231'. Thus, by performing the process of manufacturing the conventional embedded transistor structure illustrated in FIG. 1, the step-like source/drain epitaxial area 230 having a low parasitic resistance functioning as a stressor to the channel area, is formed a significantly complex process. Furthermore, on the voids 232' forming the shallow recesses, the gate insulating film 221 or the first sidewalls 223 and second sidewalls 224 are present, and therefore SiGe is embedded according to the shape of the voids 232'.

Figure 6C:
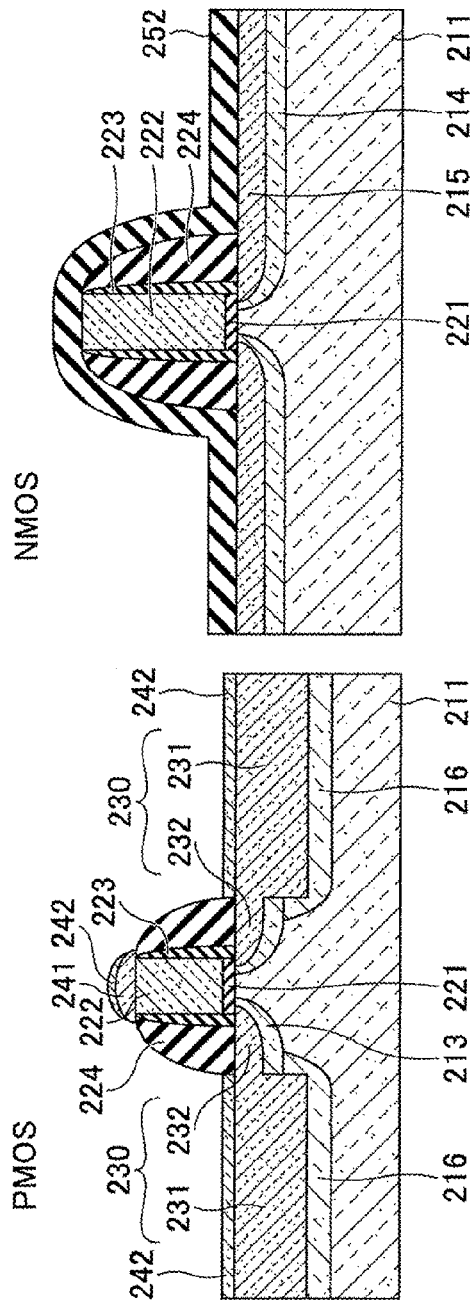

Next, according to need, Si doped with B is caused to epitaxially grow selectively on the exposed SiGe surface (FIG. 6C). According to this procedure, a Si cap layer 242 doped with B is formed on the source/drain epitaxial area 230 and the SiGe film 241 on the gate electrode 222. The Si cap layer 242 improves resistance with respect to the subsequent heating procedure during silicidation, and mitigates or prevents contamination caused by Ge included in SiGe.

Appropriate conditions for depositing the Si cap layer 242 include a temperature of 500° C. through 600° C.; $H_2$ partial pressure of 20 Pa through 60 Pa; $SiH_4$ partial pressure of 1 Pa through 10 Pa; $B_2H_6$ partial pressure of 0.001 Pa through 0.006 Pa; and HCl partial pressure of 0.5 Pa through 5 Pa. More preferable conditions for depositing the Si cap layer 242 include a temperature of approximately 550° C.; $H_2$ partial pressure of approximately 40 Pa; $SiH_4$ partial pressure of approximately 2 Pa; $B_2H_6$ partial pressure of approximately 0.003 Pa; and HCl partial pressure of approximately 1 Pa. For example, the wafer is exposed in a mixed gas atmosphere for approximately 14 minutes in a temperature of 550° C., $H_2$ partial pressure of 34 Pa, $SiH_4$ partial pressure of 2 Pa, 0.1% $B_2H_6/H_2$ partial pressure of 0.6 Pa, 0.1% $B_2H_6/H_2$ partial pressure of 1.77 Pa, and HCl partial pressure of 1.25 Pa. Si doped with approximately 1E20 $cm^{-3}$ of B is selectively grown on the exposed SiGe surface at a thickness of approximately 7 nm.

Figure 6D:
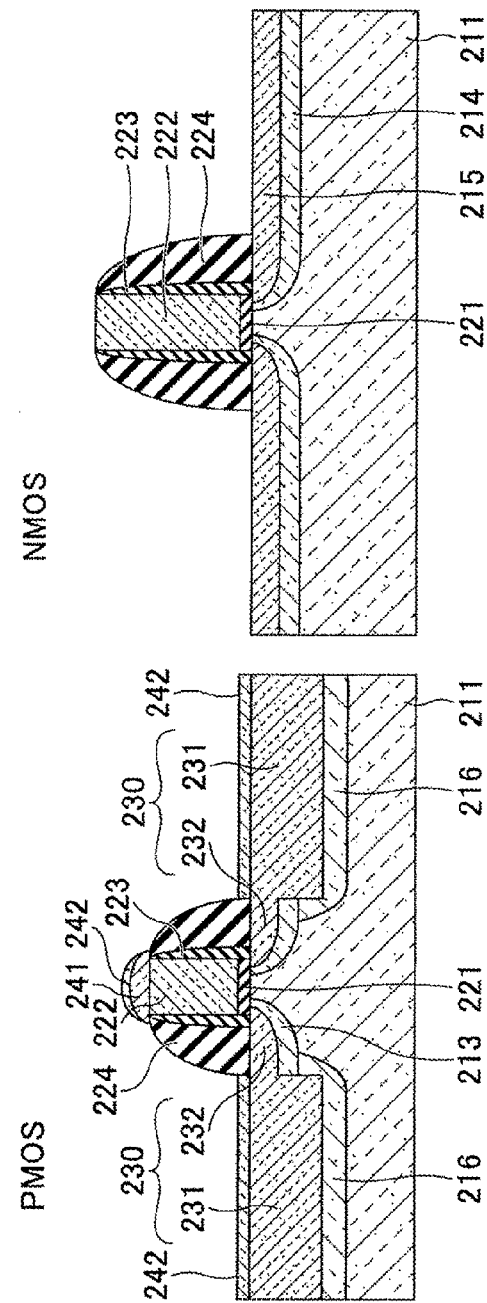

Then, the protection mask 252 formed on the NMOS formation area is removed by, for example, HF (FIG. 6D).

Figure 7A:
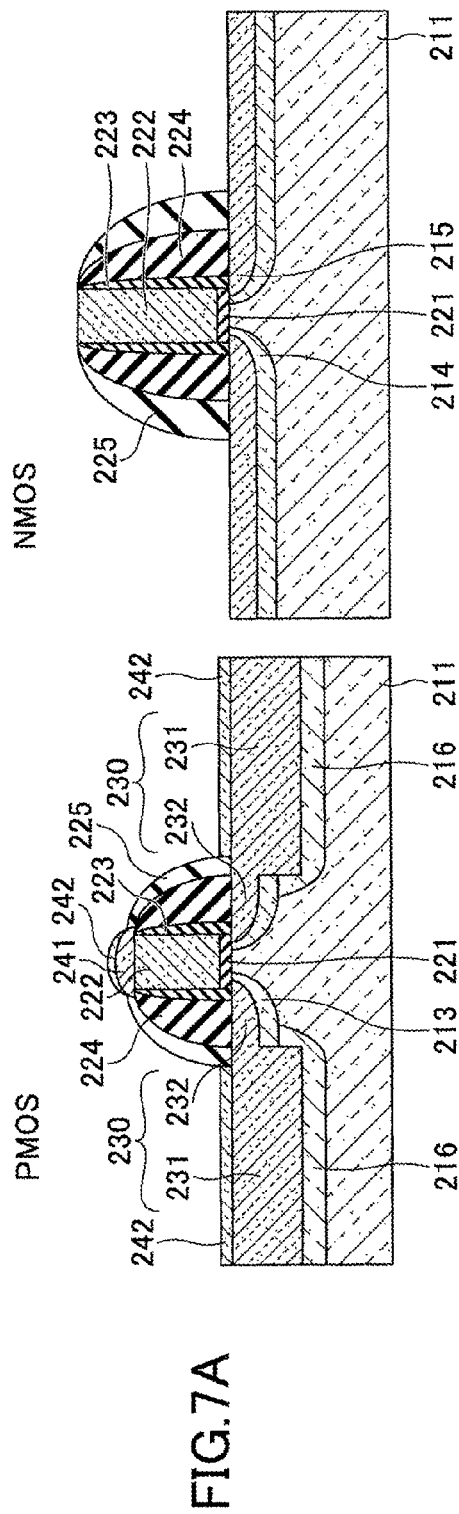
FIGS. 7A through 7C are cross-sectional views of the method of manufacturing the semiconductor device according to an embodiment of the present invention (part 4).
Figure 7B:
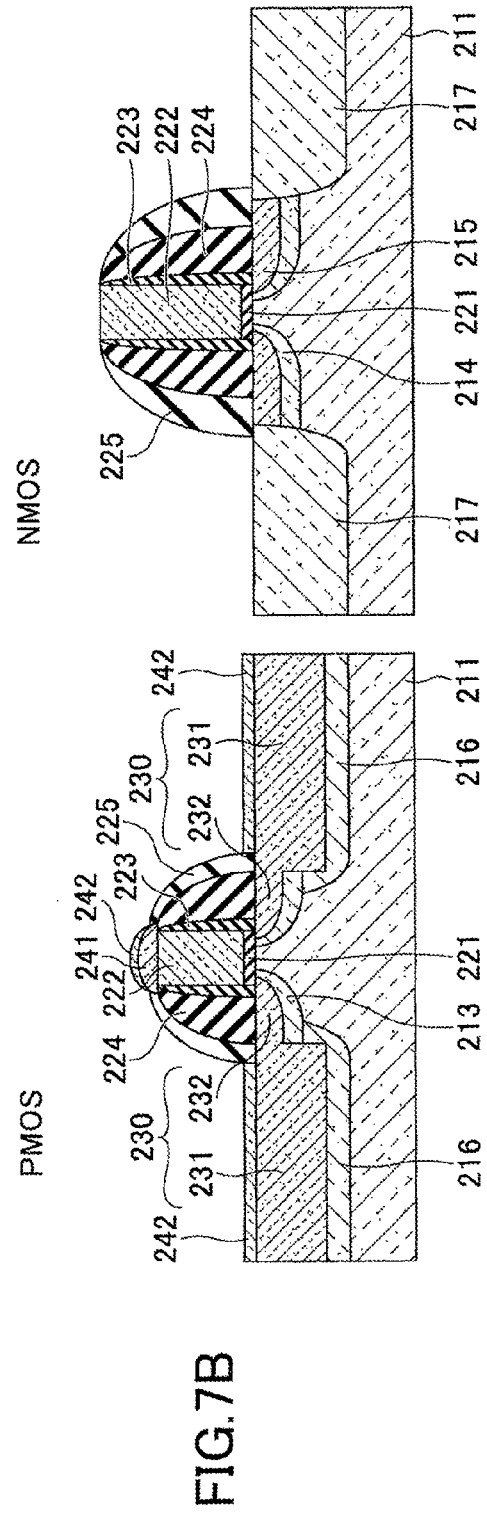
Figure 7C:
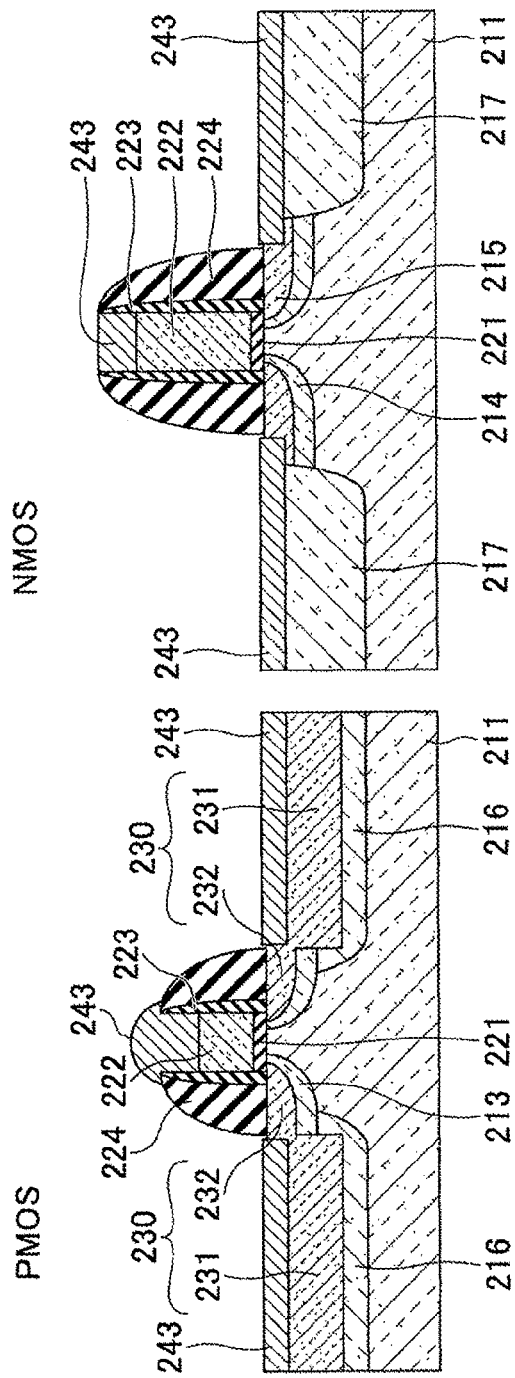

Next, according to need, sidewall spacers 225 for offsetting source/drain implantation of NMOS are formed (FIG. 7A). For example, at a temperature of approximately 530° C., a CVD-SiO film having a thickness of approximately 30 nm is deposited, and then the CVD-SiO film is etched back. Subsequently, in the NMOS formation area, for example, P is implanted and active annealing is performed to form source/drain areas 217 of NMOS (FIG. 7B). Then, after removing the sidewall spacers 225, the exposed surface of Si and/or SiGe is subjected to silicidation. Accordingly, a silicide layer 243 is formed in the source/drain area and on the gate electrode in both the PMOS formation area and the NMOS formation area (FIG. 7C). The silicide layer 243 is, for example, a NiSi layer.

Next, an interlayer insulating film, a contact, a wiring layer, etc., are formed, so that a semiconductor device including a PMOS embedded with SiGe is formed.

The present invention is not limited to the specific embodiments described herein, and variations and modifications may be made without departing from the scope of the present invention.

According to one embodiment of the present invention, a step-like source/drain epitaxial area functioning as a stressor is formed by one selective epitaxial process.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
   forming a first gate electrode above a semiconductor substrate;
   forming a dopant implantation area in the semiconductor substrate by implanting a dopant in the semiconductor substrate, using the first gate electrode as a mask;
   forming sidewall spacers on the first gate electrode;
   forming a first recess having a first depth and exposing the dopant implantation area within the first recess at least at a bottom of the first recess by etching the semiconductor substrate, using the first gate electrode and the sidewall spacers as a mask;
   forming a second recess having a second depth shallower than the first depth and exposing the dopant implantation area within the second recess by removing a part of the dopant implantation area positioned below the sidewall spacers; and
   forming a source area and a drain area by causing a semiconductor material to grow in the first recess and the second recess,
   wherein each of the first depth and the second depth is a distance taken from a bottom surface of the first gate electrode towards a bottom of the semiconductor substrate along a direction perpendicular to the bottom surface of the first gate electrode.

2. The method according to claim 1, wherein
   the forming the second recess is performed in an epitaxial growth device, and
   the forming the source area and the drain area are performed in the epitaxial growth device.

3. The method according to claim 1, wherein
   the semiconductor substrate is formed by a silicon substrate, and
   the dopant is arsenic or phosphorus.

4. The method according to claim 3, wherein the forming the second recess includes selectively etching the dopant implantation area with respect to the semiconductor substrate, by using gas including chlorine gas.

5. The method according to claim 3, wherein the forming the dopant implantation area includes implanting arsenic as the dopant, by a dose amount within a range of $1 \times 10^{14}$ cm$^{-2}$ to $1 \times 10^{16}$ cm$^{-2}$.

6. The method according to claim 3, wherein the forming the source area and the drain area forms the source area and the drain area to include silicon germanium.

7. The method according to claim 3, further comprising:
   forming a silicon layer on the source area and the drain area.

8. The method according to claim 1, wherein
   the semiconductor device includes a P-type transistor and an N-type transistor,
   the dopant implantation area includes a P-type transistor formation area to form the P-type transistor, and an N-type transistor formation area to form the N-type transistor, and
   the forming the dopant implantation area includes implanting a dopant in both the P-type transistor formation area and the N-type transistor formation area.

9. The method according to claim 1, wherein
   the forming the dopant implantation area includes forming a first dopant implantation area in the semiconductor substrate, and forming a second dopant implantation area on the first dopant implantation area,
   the forming the first recess exposes the first dopant implantation area within the first recess, and
   the forming the second recess having the second depth exposes the first dopant implantation area within the second recess by removing the second dopant implantation area positioned below the sidewall spacers.

10. The method according to claim 9, wherein each of the first dopant implantation area and the second dopant implantation area is formed by an ion implantation.

11. The method according to claim 10, wherein the first dopant implantation area is formed by a first ion implantation with a first energy by a first dose amount, and the second dopant implantation area is formed by a second ion implantation with a second energy lower than the first energy by a second dose amount higher than the first dose amount.

12. The method according to claim 1, wherein
   the forming the first gate electrode includes forming a second gate electrode above the semiconductor substrate, and
   the forming the first recess makes a height of the first gate electrode lower than a height of the second gate electrode.

13. The method according to claim 12, wherein
   the semiconductor device includes a P-type transistor and an N-type transistor,
   the dopant implantation area includes a P-type transistor formation area to form the P-type transistor, and an N-type transistor formation area to form the N-type transistor, and
   the forming the dopant implantation area includes implanting a dopant in both the P-type transistor formation area and the N-type transistor formation area.

14. The method according to claim 1, wherein the forming the first recess forms the first recess to the first depth shallower than a depth of the dopant implantation area so that the dopant implantation area remains after the first recess is formed.

15. The method according to claim 1, wherein
   the forming the second recess is performed in an epitaxial growth device, and
   the forming the source area and the drain area are performed in the epitaxial growth device, continuously to the forming the second recess.

* * * * *